(12) United States Patent
Muramatsu et al.

(10) Patent No.: US 8,222,532 B2
(45) Date of Patent: Jul. 17, 2012

(54) METHOD FOR MANUFACTURING A WIRING BOARD

(75) Inventors: Shigetsugu Muramatsu, Nagano (JP); Yasuhiko Kusama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 13/150,691

(22) Filed: Jun. 1, 2011

(65) Prior Publication Data

US 2011/0253422 A1 Oct. 20, 2011

Related U.S. Application Data

(62) Division of application No. 11/946,360, filed on Nov. 28, 2007, now Pat. No. 8,037,596.

(30) Foreign Application Priority Data

Nov. 30, 2006 (JP) ................................. 2006-324126

(51) Int. Cl.
*H05K 1/03* (2006.01)
*H01K 3/10* (2006.01)

(52) U.S. Cl. ........ 174/255; 174/258; 174/260; 174/261; 174/263; 174/264; 29/852

(58) Field of Classification Search .................. 29/852, 29/830, 831, 832, 846, 847; 438/623, 624, 438/629, 638, 637, 690; 257/758, 127, 170, 257/409, 452; 174/252, 250, 260, 261, 262; 361/763, 766, 670, 678, 760, 792, 793, 794, 361/795

See application file for complete search history.

(56) References Cited

U.S. PATENT DOCUMENTS

| | | | |
|---|---|---|---|
| 5,305,519 A | 4/1994 | Yamamoto et al. | |
| 5,316,894 A | 5/1994 | Takahashi et al. | |
| 5,486,492 A | 1/1996 | Yamamoto et al. | |
| 6,010,956 A * | 1/2000 | Takiguchi et al. | 438/623 |
| 6,316,351 B1 * | 11/2001 | Chen et al. | 438/638 |
| 6,629,366 B1 | 10/2003 | Kobayashi | |
| 6,838,771 B2 * | 1/2005 | Tanaka et al. | 257/758 |
| 2002/0084456 A1 * | 7/2002 | Sugihara et al. | 257/48 |
| 2003/0204949 A1 | 11/2003 | Chih | |
| 2004/0241904 A1 | 12/2004 | Lee et al. | |
| 2006/0226202 A1 | 10/2006 | Yang | |

FOREIGN PATENT DOCUMENTS

| | | |
|---|---|---|
| JP | 10-107446 | 4/1998 |
| JP | 10-284835 | 10/1998 |
| JP | 2000-286362 | 10/2000 |
| JP | 2000-294678 | 10/2000 |
| JP | 2001-007240 | 1/2001 |
| JP | 2001-109162 | 4/2001 |
| JP | 2003-234578 | 8/2003 |
| JP | 2004-048048 | 2/2004 |
| JP | 2005-045163 | 2/2005 |
| JP | 2006-344664 | 12/2006 |

* cited by examiner

*Primary Examiner* — Derris Banks
*Assistant Examiner* — Tai Nguyen
(74) *Attorney, Agent, or Firm* — Rankin, Hill & Clark LLP

(57) ABSTRACT

A wiring board includes: an uppermost wiring layer formed on a prescribed number of underlying wiring layers, a portion of the uppermost wiring layer being exposed and used as a pad for connection with a component to be mounted; and an insulation resin layer covering the uppermost wiring layer, wherein the thickness of the portion of the uppermost wiring layer is larger than that of other portions thereof.

8 Claims, 13 Drawing Sheets

METHOD FOR MANUFACTURING A WIRING BOARD

This application is a divisional of parent application Ser. No. 11/946,360, based on and claims priority from Japanese Patent Application No. 2006-324126, filed on Nov. 30, 2006, the entire contents of which are hereby incorporated by reference.

BACKGROUND OF THE INVENTION

1. Technical Field

The present invention relates to a wiring board and a method of manufacturing the same. More particularly, the present invention relates to a wiring board for mounting semiconductor chips, semiconductor components, and other mounting components thereon, or a wiring board for mounting semiconductor chips, semiconductor components, and other mounting components thereon, and establishing connection with another board (e.g., a package for flip-chip connection), and a method of manufacturing the same.

2. Background Art

When semiconductor chips, semiconductor components, and other mounting components are mounted on a wiring board, generally, the part, except for the portions (which are generally referred to as "pads") necessary for connection with chips and the like in mounting of wiring on the outermost layer of the wiring board, is protected using a resin material referred to as a solder resist for protection from adhesion of solder, contamination, and the like. In that case, exposure of the wiring portions necessary for connection is accomplished by a photolithography method, a screen printing method, a laser processing method, or the like. According to a photolithography method, by use of a photosensitive one as a resin material for the solder resist, patterning by exposure to light and development is carried out. According to a screen printing method, by use of a printing mask, a resin material is printed on only necessary portions. According to laser processing, a resin material is coated on the entire surface, and then, the resin material on the region to be exposed is removed by laser light irradiation.

As one example, a description will be given to exposure of pads by patterning with photolithography of an insulation resin (solder resist) in the related art. As shown in FIG. 12A, on an insulation board 101, a required number of underlying wirings 102 and an insulation layer 103 covering them are formed. Then, an uppermost wiring layer 104 and an insulation resin (solder resist) layer 105 covering it are formed. Subsequently, the insulation resin layer 105 is exposed and developed through photolithography, thereby forming openings in a prescribed pattern as shown in FIG. 12B. As a result, portions of the uppermost wiring 104 are exposed as pads 106 (top side) and 106' (bottom side).

In the case by a screen printing method, after forming the elements including up to the uppermost wiring layer 104 of FIG. 12A, an insulation resin is screen printed by the use of a mask having a prescribed pattern, thereby forming an insulation resin layer having the same opening pattern as that shown in FIG. 12B.

It is also known that pads are exposed at the wiring board surface using a sandblast method. In this case, a resist mask for sandblast including openings formed at the portions corresponding to the pads to be exposed is formed. Thus, an air flow containing abrasive grains is applied to the openings to expose the pad portions. For example, in Japanese Unexamined Patent Documents: JP-A-2000-286362, JP-A-2000-294678 and JP-A-2001-7240, a sandblast method for exposure of pads is described.

A conventional example of exposure of pads by a sandblast method will be described by reference to views showing one pad formation region on an enlarged scale. As shown in FIG. 13A, on an insulation board 201 (of which only one side is shown), a required number of underlying wirings 202 and an insulation layer 203 covering them are formed. Then, an uppermost wiring layer 204 and an insulation resin layer 205 covering it are formed thereon. As shown in FIG. 13B, a dry film resist (DFR) 206 for sandblast is laminated on the insulation resin layer 205, and openings in a prescribed pattern are formed through exposure/development. Then, as shown in FIG. 13C, abrasive grains 207 are sprayed to the openings so that the insulation resin is removed. As a result, a part of the wiring layer 204 is exposed and used as a pad 208. Thereafter, as shown in FIG. 13D, the DFR for sandblast is removed.

On the other hand, in the field of wafer level chip scale package (WL-CSP), the following is described. Namely, cylindrical pads formed on a conductive layer of the semiconductor chip are covered with a resin, and the pad surfaces are exposed by polishing or etching (see Japanese Unexamined Patent Document: JP-A-2004-48048).

In accordance with a recent trend for smaller size and higher precision of semiconductor chips, a wiring board for mounting them has also been decreasing in size and increasing in precision of the connection terminal. However, the solder resist (protective resin) of the outermost layer of the wiring board is required to have electric characteristics such as insulation reliability, and chemical characteristics such as adhesion with an underfill, a mold resin, or the like, necessary for mounting. Further, for the reliability improvement, there are also requirements as to the clearance between the pad in the resin layer opening and the opening inner wall, or the opening shape. It is not easy to design the composition of the solder resist so as to meet all the requirements. Particularly, in the case of the formation of openings with photolithography requiring the use of a photosensitive solder resist material, it is difficult to improve the dimensional precision of the opening. Further, in the case of photolithography, there is also a problem of misalignment of a photomask, which also causes impediment to the improvement of the dimensional precision of the opening.

According to a technique of screen printing or laser processing, the solder resist layer is not directly patterned by photolithography (a solder resist to which photosensitivity has been imparted is not used). Therefore, the technique is advantageous in terms of the chemical composition of the solder resist. However, in the case of screen printing, there is also a problem of misalignment of the printing mask. Further, it is not easy to form a fine pattern necessary for the reduction in size and the enhancement in precision with a printing method. The problem of misalignment also applies to the case of laser processing. Whereas, in the case of laser processing, variations in processing dimensions or shape are unavoidable.

According to the sandblast method, the solder resist layer is not directly patterned by photolithography. Therefore, the technique is also advantageous in terms of the chemical composition of the solder resist. However, also in this case, when the position of the resist mask for sandblast is shifted, the pads of necessary position/area become impossible to expose. Therefore, high precision alignment of the mask becomes necessary. However, the wiring board largely changes in dimensions with temperature changes and processing. In the case of fine wiring, high precision alignment between the portion to be exposed and the resist mask for sandblast becomes difficult. For this reason, for exposure of pads with a sandblast method in the related art, the width of the uppermost layer wiring 204 must be formed wider (e.g., by about 10 μm per side) than the width necessary for the pad in view of the misalignment between the opening to be formed by sandblast and the uppermost layer wiring 204 including the pad portion to be exposed shown in FIG. 13D. The excess amount of the wiring width becomes disadvantageous in terms of design when the wiring pitch is narrowed with a reduction in size of mounting components.

Thus, it has become increasingly difficult to expose a pad for connection with a surface-mounted component from a resin layer such as a solder resist of the wiring board outermost layer of the fine wiring for mounting surface-mounted components such as chips reduced in size and enhanced in precision with high precision.

SUMMARY OF THE INVENTION

The present invention provides a method for manufacturing a wiring board where pads can be exposed at the resin layer of the wiring board outermost layer with high precision, and a wiring board manufactured using the method and having pads exposed at the resin layer of the outermost layer with high precision.

According to a first aspect of the present invention, a wiring board comprises:

an uppermost wiring layer formed on a prescribed number of underlying wiring layers, a portion of said uppermost wiring layer being exposed and used as a pad for connection with a component to be mounted; and an insulation resin layer covering the uppermost wiring layer, wherein the thickness of the portion of the uppermost wiring layer is larger than that of other portions thereof.

According to a second aspect of the present invention, a method for manufacturing a wiring board, the method comprises:

forming the uppermost wiring layer on a prescribed number of underlying wiring layers, such that a portion of the uppermost wiring layer has a thickness larger than other portions thereof.

forming an insulation resin layer covering the entire uppermost wiring layer; and removing a portion of the insulation resin layer until a top of the portion of the uppermost wiring layer is exposed, thereby forming a pad.

According to a third aspect of the present invention, a part of the insulation resin layer may be removed by buff grinding, resin etching, or sandblast.

According to a fourth aspect of the present invention, a method for manufacturing a wiring board, the method comprises:

forming an uppermost wiring layer on a prescribed number of underlying wiring layers;

forming an insulation resin layer covering the entire uppermost wiring layer;

forming a mask for sandblast having an opening wider than a portion to be exposed of the uppermost wiring layer on the insulation resin layer; and exposing a portion of the uppermost wiring layer by means of a sandblast treatment using the mask, thereby forming a pad.

According to a fifth aspect of the present invention, the uppermost wiring layer may be formed such that only the portion to be exposed of the uppermost wiring layer has a lager thickness than other portions thereof.

According to a sixth aspect of the present invention, the whole of the uppermost wiring layer may be formed with an equal thickness.

According to the present invention, it is possible to provide a wiring board in which pads for mounting semiconductor chips or the like are exposed with high precision in response to the reduction in size and the enhancement in precision of the semiconductor chips or the like.

DETAILED DESCRIPTION OF EXEMPLARY EMBODIMENTS

Exemplary embodiments of the present invention will now be described by reference to the drawings.

Figure 1:
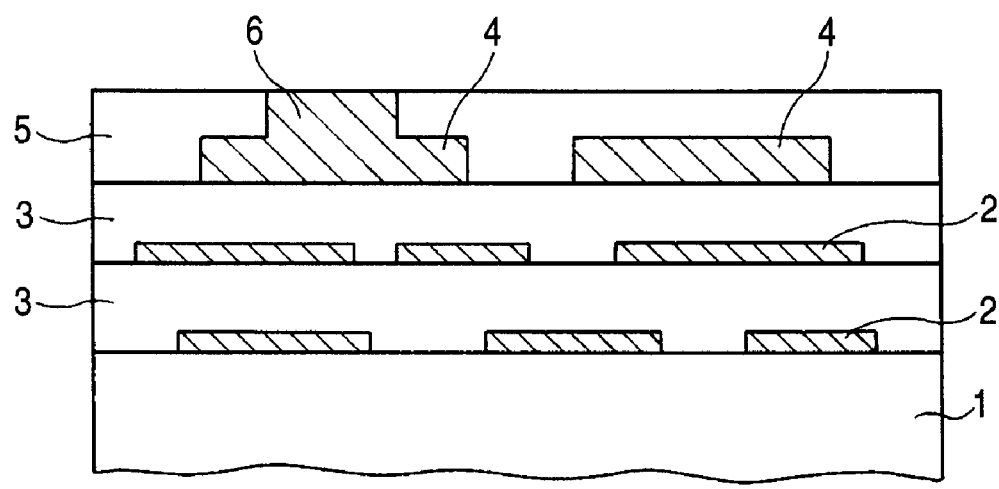
FIG. 1 is a schematic view illustrating a wiring board in accordance with the present invention, wherein the thickness of a portion to be exposed as a pad of an uppermost wiring layer is larger than that of other portions.

FIG. 1 schematically shows a wiring board of the present invention, in which the thickness of a portion to be exposed as a pad of an uppermost wiring layer is larger than that of other portions. This diagram shows respective ones of the portions including pads therein and the portions not including pads therein of the uppermost layer wirings. On an insulation board (core board) 1, a prescribed number of underlying wiring layers 2 and insulation layers 3 covering them are formed. On the uppermost insulation layer 3, an uppermost wiring layer 4 is provided, which is covered with an insulation resin layer 5. A part of the uppermost wiring has a pad 6 exposed from the surface of the insulation resin layer 5 for connection with a surface-mounted component such as a semiconductor chip to be mounted on the wiring board. Apparent from the diagram, the portion to be exposed as a pad of the uppermost wiring layer 4 is larger in thickness than other portions thereof, and the surface of the insulation layer is flush therewith. In FIG. 1, for simplification, only one side of the insulation board (core board) 1 is shown. However, generally, wiring layers are also provided on the opposite side.

Such a wiring board can be manufactured in the following manner. The uppermost wiring layer 4 including a wiring layer in thickness at a portion thereof than at other portions (FIG. 1) is formed by, for example, a two-step plating process using a semi-additive method or by patterning a wiring layer through photolithography (a subtractive method). Then, an insulation resin layer covering the whole of the uppermost wiring layer 4 is formed. Thereafter, by the use of, for example, buff grinding, resin etching, or sandblast, a part of the insulation resin layer is removed until the top side of the pad 6 (FIG. 1) is exposed. Particularly, when resin etching or sandblast is used, preferably, the following is carried out. Namely, a prescribed amount of a resin material is placed on the uppermost wiring layer 4 so that the thickness to be removed becomes equal over the entire surface of the board. Thus, the resin material is pressed, so that an insulation resin layer having a flat surface is formed. Then, a part thereof is removed.

The thickness of the resin layer to be removed, namely, the thickness of the resin material provided on the pad is preferably smaller from the viewpoint of productivity. In the present invention, the thickness of the resin layer to be removed is preferably 10 µm or less, and more preferably 5 µm or less.

Figure 2A:
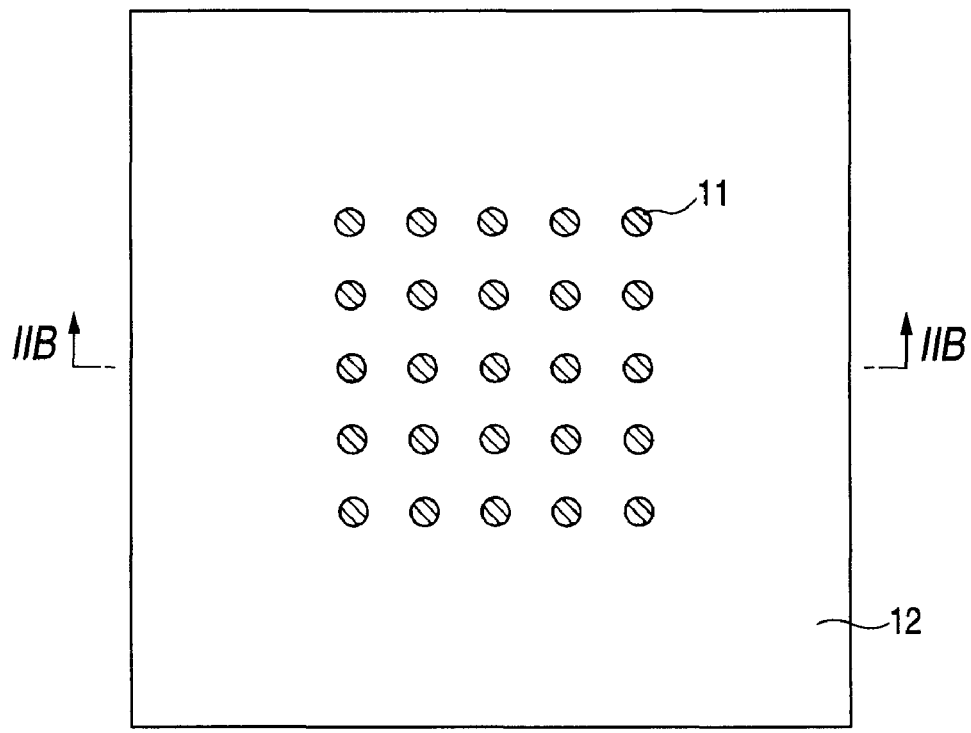
FIGS. 2A and 2B are schematic views illustrating a wiring board of the present invention, having matrix arrayed pads.
Figure 2B:
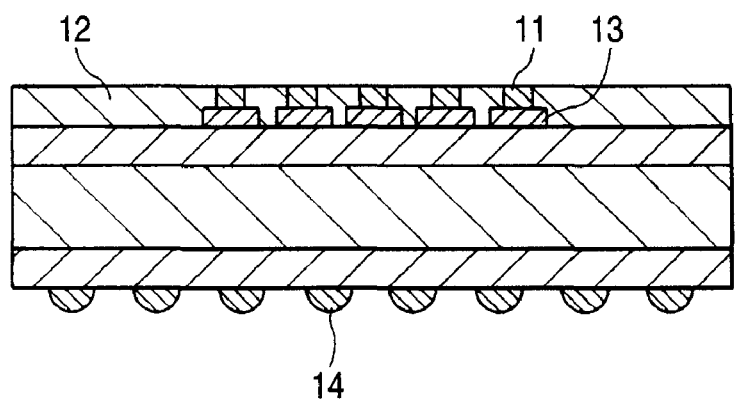

An example of a wiring board of the present invention having matrix arrayed pads is shown in FIG. 2A (top view) and FIG. 2B (cross sectional view along line IIb-IIb of FIG. 2A). As shown in FIG. 2A, the top side of the wiring board is covered with an insulation resin layer 12, except that the pads 11 are exposed for connection with chips to be mounted, or the like. In the cross sectional view shown in FIG. 2B, for simplification, other wiring layers than the uppermost wiring layer 13 to be connected with the pads 11 each for mounting a chip thereon are omitted. Further, there are also omitted wiring to be connected with solder bumps 14, and the solder bumps 14 is provided on the back side of the wiring board and used for mounting the wiring board mounted with chips or the like on another wiring board (not shown).

Figure 3A:
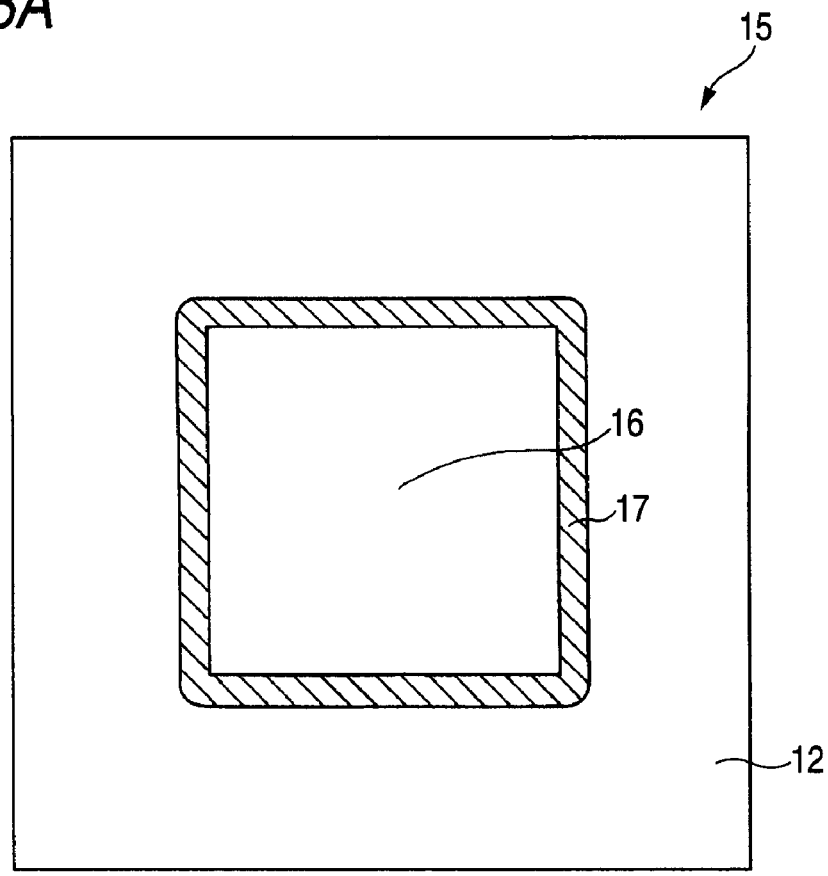
FIGS. 3A and 3B are schematic views illustrating a wiring board including a semiconductor chip mounted thereon.

The wiring board shown in FIGS. 2A and 2B including a semiconductor chip mounted thereon is shown in FIGS. 3A (top view) and 3B (side view). An underfill material 17 is filled between a semiconductor chip 16 connected to a wiring board 15 via a solder bump or the like (not shown) and the board 15, and a part of the underfill material 17 is provided around the semiconductor chip 16.

Figure 3B:
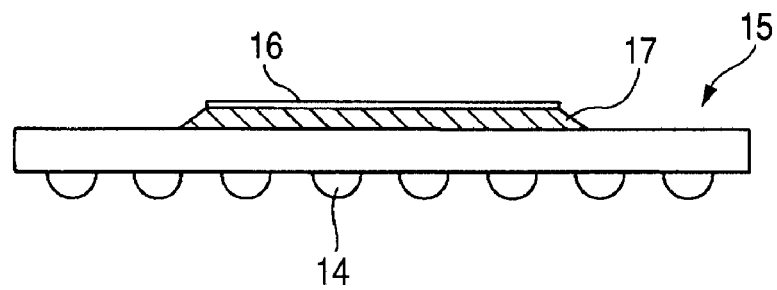
Figure 4A:
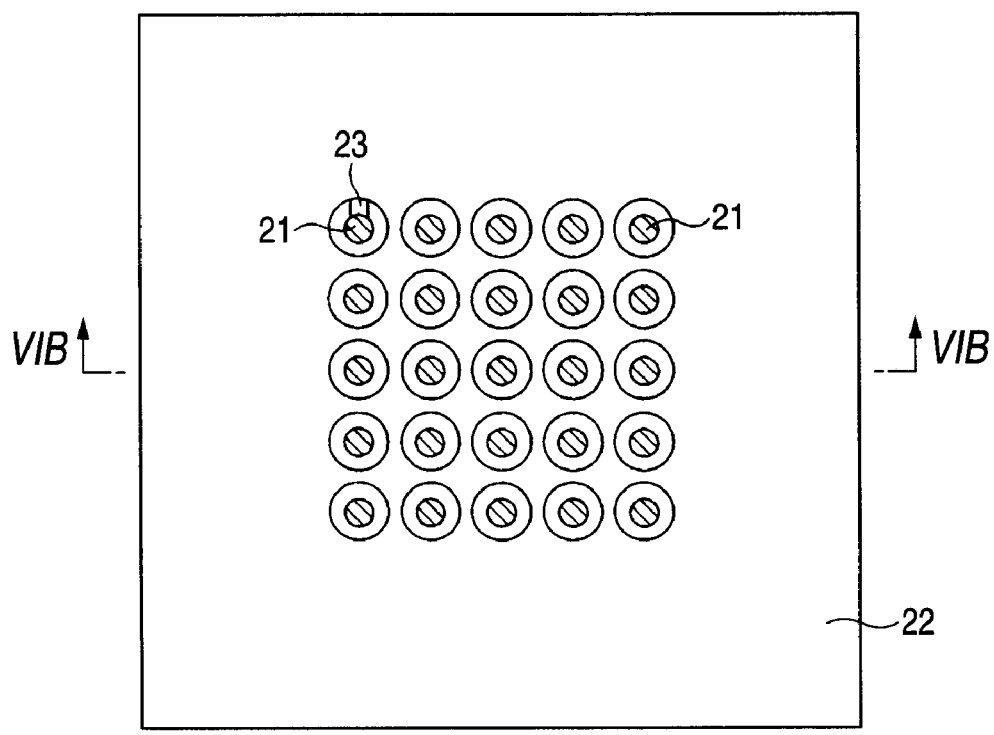
FIGS. 4A and 4B are schematic views illustrating a wiring board having matrix arrayed pads in accordance with the related art.
Figure 4B:
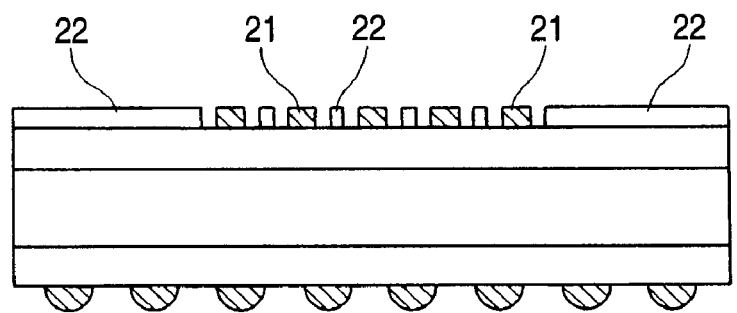

A wiring board having pads in the same matrix arrangement with the related art is shown in FIG. 4A (top view) and FIG. 4B (a cross sectional view along line IVb-IVb of FIG. 4A, simplified similarly as with FIG. 2B). Pads 21 are provided in each opening of an insulation layer 22 formed with a clearance therearound. When wirings 23 connected to the pads (shown only in the uppermost left opening of FIG. 4A) are provided in the uppermost wiring layer, a part thereof is exposed in each opening. A semiconductor chip is mounted to the wiring board with the related art, and an underfill material is filled between the chip and the board. As a result, the outward appearance becomes the same as the board of the present invention which is mounted with a chip and shown in FIG. 3.

The wiring board in which pads are exposed from the resin layer of the wiring board outermost layer with high precision can also be obtained using another manufacturing method of the present invention. According to this method, the uppermost wiring layer is formed, and the insulation resin layer covering the entire uppermost wiring layer is formed. Then, the resin layer in mask openings is removed by sandblast by the use of a mask for sandblast formed on the insulation resin layer. As a result, pads are exposed. The mask for sandblast is formed so as to have openings each wider than each pad portion to be exposed of the uppermost wiring layer. From the viewpoint of precision of alignment, the clearance between the pad edge and the mask opening is preferably set to be about 3 to 10 µm. The clearance portion in the mask opening before sandblast is a portion under which there is no uppermost layer wiring to be exposed. After sandblast, the insulation resin material is removed, so that a difference in level from the masked portion is caused. The difference in level can be controlled to a practically trouble-free level by making small the thickness of the resin layer to be removed, i.e., the thickness of the resin material provided on the pads. Further, from the viewpoint of productivity, the thickness of the resin layer to be removed is likewise preferably smaller. From this, the thickness of the resin layer to be removed is preferably 10 µm or less, and more preferably 5 µm or less.

According to this method, the uppermost wiring layer may be formed such that only the portions to be exposed as pads have a thickness larger than other portions. Alternatively, the entire uppermost wiring layer may be formed with an equal thickness.

Figure 5A:
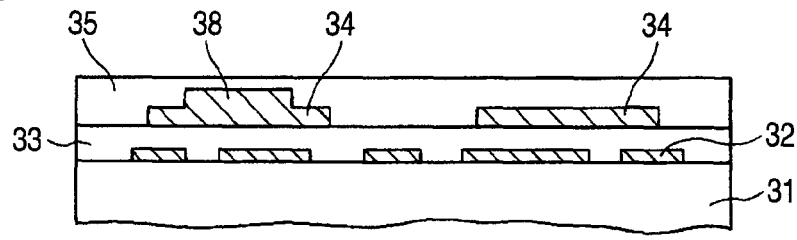
FIGS. 5A to 5D are schematic views illustrating a manufacturing method in accordance with the present invention.
Figure 5B:
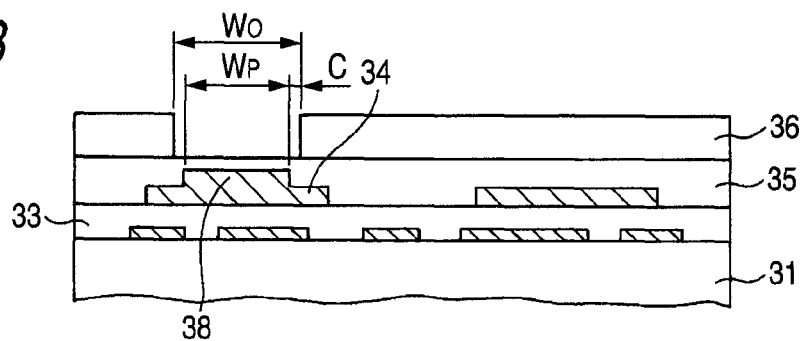
Figure 5C:
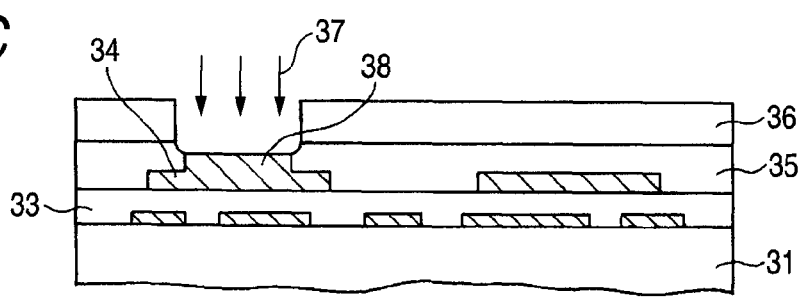
Figure 5D:
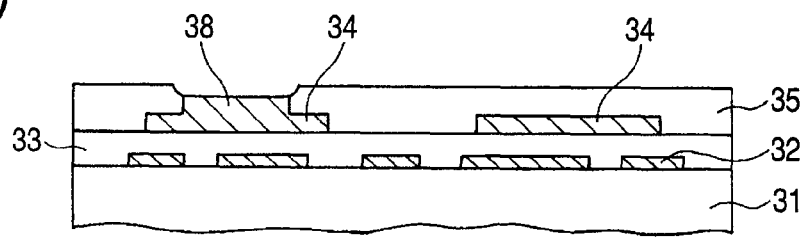

When only the portions to be exposed as pads of the uppermost wiring layer are formed larger in thickness than other portions, as shown in FIG. 5A, on an insulation board 31, a required number of underlying wirings 32, and an insulation layer 33 covering them are formed. Then, an uppermost wiring layer 34 and an insulation resin layer 35 covering it are formed. A part (in FIG. 5A, the left-side wiring) of wirings of the uppermost wiring layer 34 has a portion 38 formed larger in thickness than other portions, and to be exposed as a pad later. As shown in FIG. 5B, a dry film resist (DFR) laminated on the insulation resin layer 35 is patterned by exposure/development, thereby forming a mask 36 for sandblast having an opening in a prescribed pattern corresponding to the position of the pad 38 to be exposed later. It is preferably configured such that the opening width $W_o$ of the mask 36 is a little larger than the width $W_p$ of the pad 38, and such that the clearance C between the pad edge and the mask opening is about 3 to 10 µm. As shown in FIG. 5C, to the opening of the mask 36, abrasive grains 37 are blown to remove the insulation resin. As a result, a part of the wiring layer 34 is exposed as the pad 38. The thickness of the resin layer to be removed is preferably 10 µm or less, and more preferably 5 µm. Then, as shown in FIG. 5D, the DFR for sandblast is removed.

Figure 6A:
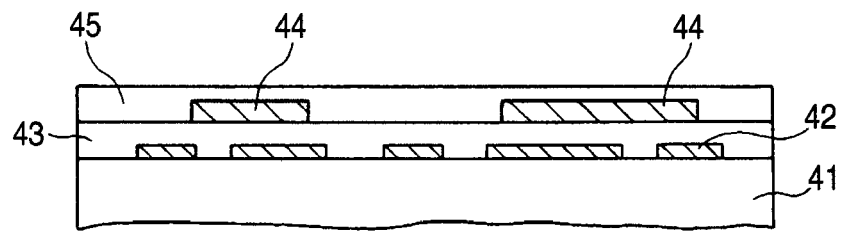
FIGS. 6A to 6D are schematic views illustrating another manufacturing method in accordance with the present invention.
Figure 6B:
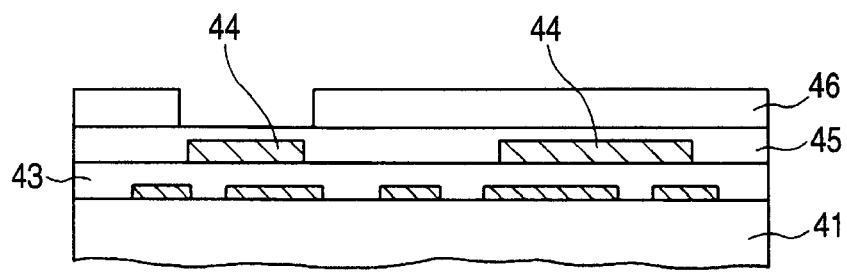
Figure 6C:
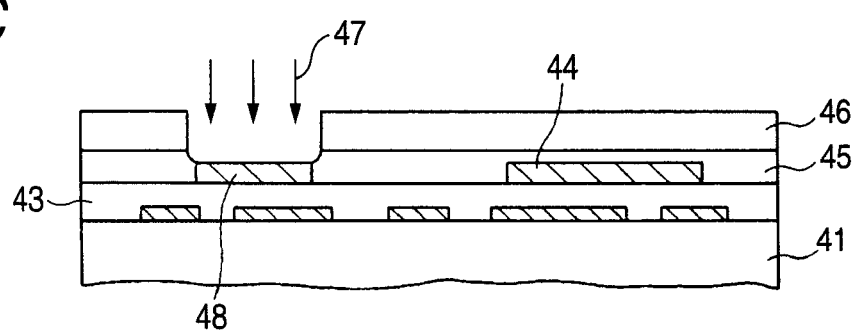
Figure 6D:
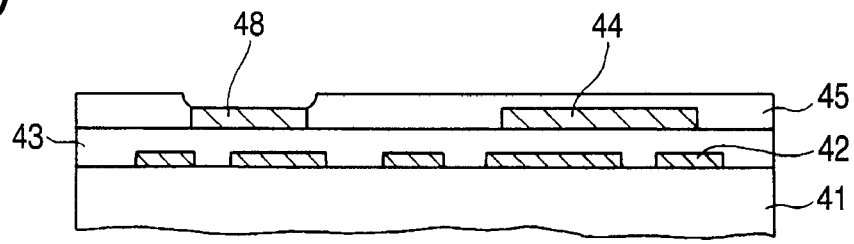

When the entire uppermost wiring layer is formed with the same thickness, as shown in FIG. 6A, a required number of underlying wirings 42, and an insulation layer 43 covering them are formed on an insulation board 41. Then, an uppermost wiring layer 44 with an equal thickness, and an insulation resin layer 45 covering it are formed. Subsequently, as with the case where only the portions to be exposed as pads of the uppermost wiring layer are formed larger in thickness than other portions, a dry film resist (DFR) laminated on the insulation resin layer 45 is patterned. As a result, a mask 46 for sandblast in a pattern having a little larger opening width than the width of each pad is formed (FIG. 6B). Thus, to the opening of the mask 46, abrasive grains 47 are blown to expose a part of the wiring layer 44 as a pad (FIG. 6C). Then, the DFR for sandblast is removed (FIG. 6D). Also in this case, the clearance between the pad edge and the mask opening is preferably about 3 to 10 μm. The thickness of the resin layer to be removed is preferably 10 μm or less, and more preferably 5 μm or less.

According to the wiring board manufactured in this manner, as shown in FIG. 6D, the thickness of the portion of the insulation layer 45 covering the wirings 44 is the same as the thickness (as described above, the most preferred thickness is 5 μm or less) of the insulation layer to be removed by sandblast, and it is relatively small. For this reason, the insulation characteristic of the portion covering the wirings 44 cannot match the insulation characteristic of the portion covering the wiring in the wiring board in which a part of the uppermost layer wirings has a thickness larger than other portions for a pad as seen in FIG. 5D. However, in order to form a part of the uppermost layer wirings having a thickness larger than other portions for a pad, the uppermost wiring layer is required to be formed in two steps (for example, by a two-step plating treatment using a semi-additive method). For this reason, when pads are formed by the use of a wiring layer with the same thickness, the manufacturing step is advantageously simple as compared with the case where the pad portions are made larger in thickness than other portions.

Thus, in accordance with the present invention, either in the case where a pad is formed from a wiring partly increased in thickness, or in the case where a pad is formed from a wiring with the equal thickness, the entire top side of the objective pad is exposed even when slight misalignment occurs.

Figure 7A:
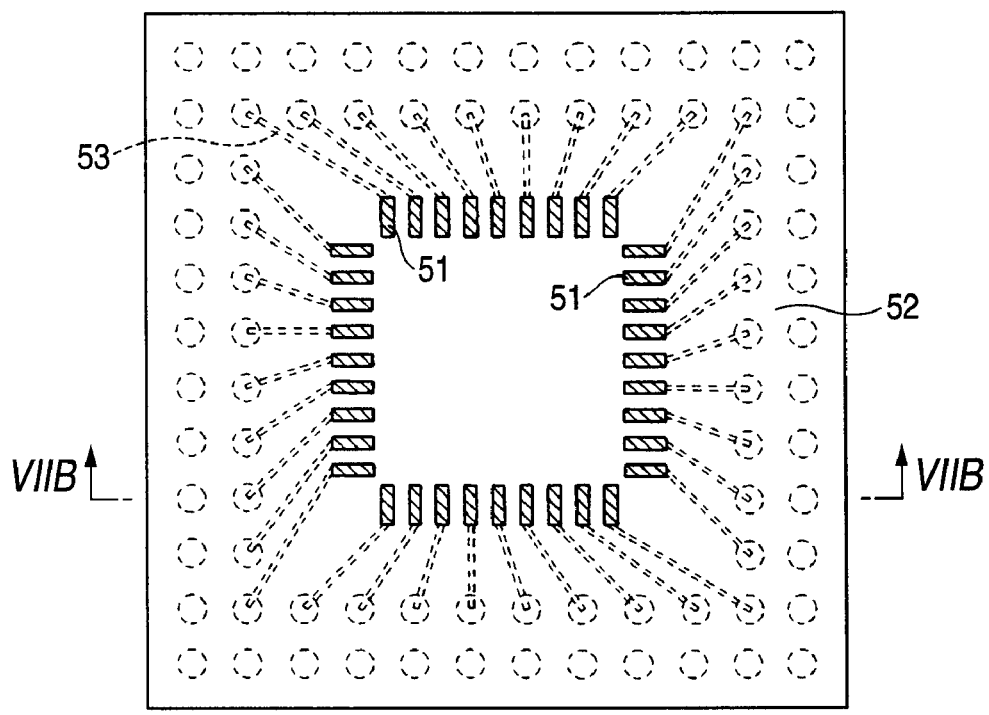
FIGS. 7A and 7B are schematic views illustrating a wiring board of the present invention, having peripheral arrayed pads.
Figure 7B:
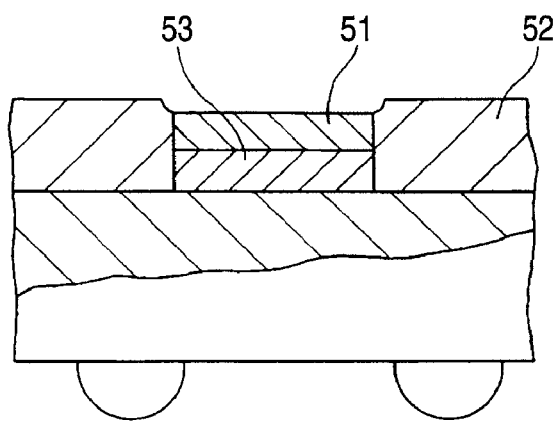

An example of the wiring board of the present invention—which has peripheral arrayed pads and is manufactured by forming pads through sandblast process of the mask openings—is shown in FIG. 7A (top view), and FIG. 7B (a partially enlarged view of a cross section along line VIIb-VIIb of FIG. 7A). The pads of this example are formed larger in thickness than other portions of the uppermost layer wirings. Pads 51 are each exposed in each opening formed in an insulation resin layer 52. The width of each pad 51 is slightly smaller than the opening width of an insulation resin layer 52. For simplification, the openings of the insulation resin layer are not shown in FIG. 7A. A wiring 53 (FIG. 7A) connected to the pad 51 is covered with the insulation layer 52. On the wiring board of the present invention having peripheral arrayed pads, semiconductor chips are mounted. Then, an underfill material is filled between the chips and the board. As a result, the outward appearance becomes the same as with the wiring board of the present invention having matrix arrayed pads (see, FIGS. 3A and 3B).

Figure 8A:
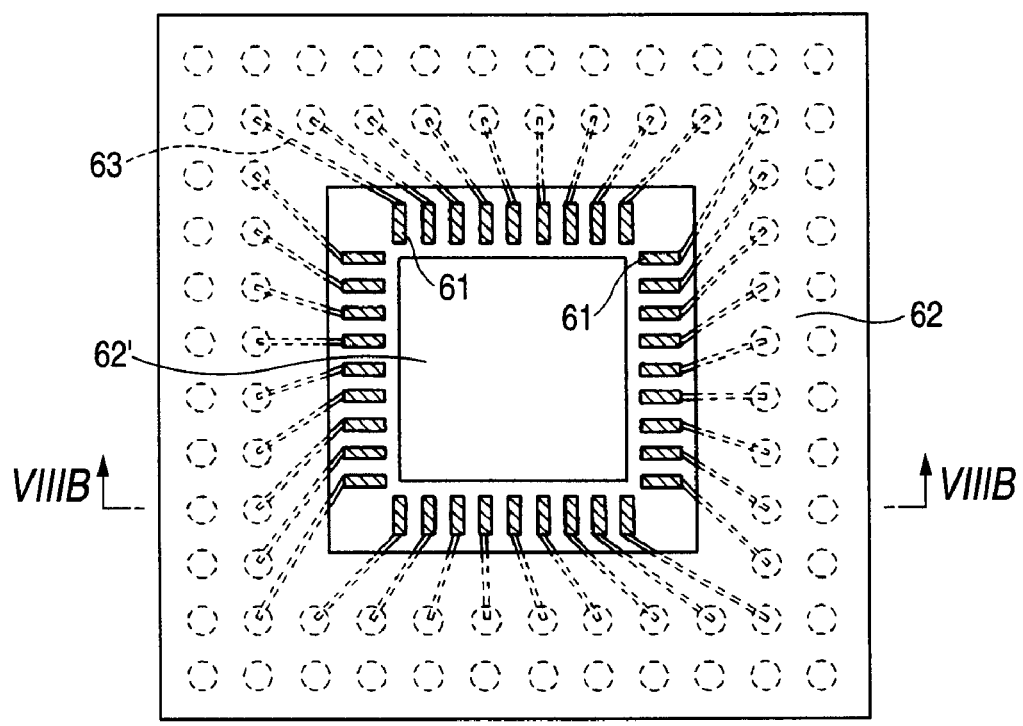
FIGS. 8A and 8B are schematic views illustrating a wiring board having peripheral arrayed pads in accordance with the related art.
Figure 8B:
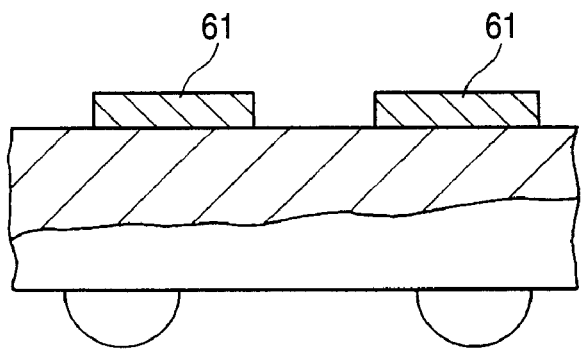

The same wiring board having peripheral arrayed pads in accordance with the related art is shown in FIG. 8A (top view), and FIG. 8B (a partially enlarged view of a cross section along line VIIIb-VIIIb of FIG. 8A). Pads 61 are exposed at a rectangular band-like region (formed by patterning an insulation resin layer covering the whole of the uppermost wiring layer including pads) between an uppermost layer insulation resin layer 62 in the outer side region and an uppermost layer insulation resin layer 62' in the inner side region of the wiring board. Thus, no uppermost layer insulation resin is present between adjacent pads. Also in this case, semiconductor chips are mounted on the wiring board. Then, an underfill material is filled between the chips and the board. As a result, the outward appearance becomes the same as with the wiring board of the present invention having matrix arrayed pads (see, FIGS. 3A and 3B).

Figure 13A:
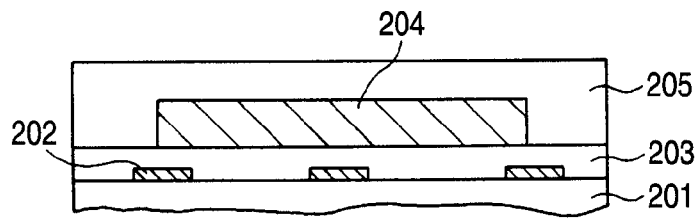
FIGS. 13A to 13D are schematic views illustrating exposure of pads using a sandblast method in accordance with the related art.
Figure 13B:
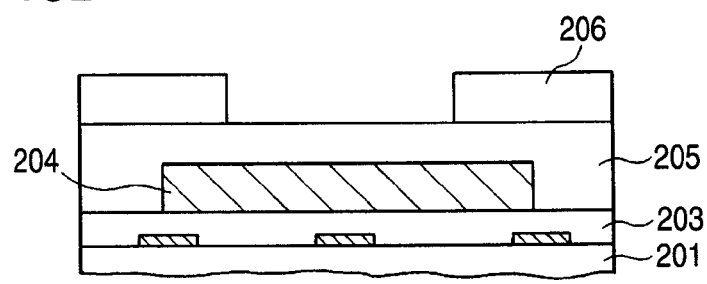
Figure 13C:
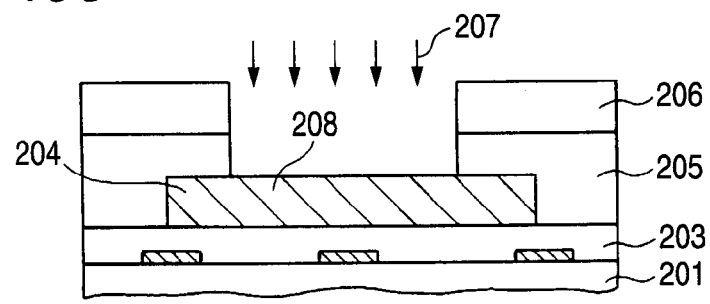
Figure 13D:
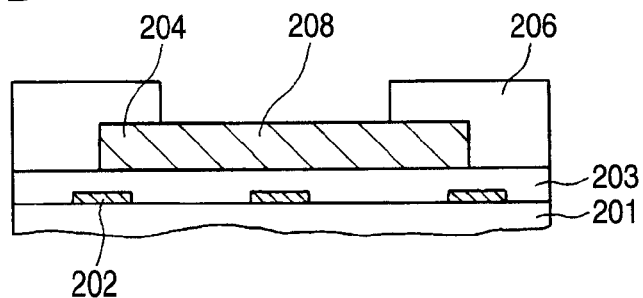

On the other hand, in the case of a board having peripheral arrayed pads exposed by opening only the pad portions with the related art (also in this case, the outward appearance of the board including semiconductor chips mounted thereon, and an underfill material filled thereon is as shown in FIGS. 3A and 3B). As described previously by reference to FIG. 13D, the wiring width at the site where a pad is provided is larger than the width necessary for the pad. This is disadvantageous in terms of design when the wiring pitch width narrows with a reduction in size of mounting components.

While the present invention will be described more specifically by way of exemplary embodiments, the following exemplary embodiments are not construed as limiting the scope of the present invention.

Any of the techniques themselves for use in each step of the manufacturing method of the present invention are known, and these will not be described more than necessary. The materials for use in the present invention also have no particular restriction. Other than those mentioned in the following exemplary embodiments, the ones for use in a general wiring board can be used.

First Exemplary Embodiment

A description will be given to an example of manufacturing of a wiring board having matrix arrayed pads.

Figure 9A:
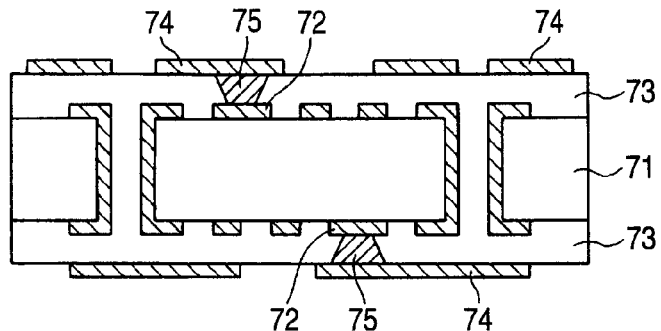
FIGS. 9A to 9D are schematic views illustrating manufacturing of a wiring board according to a first exemplary embodiment.

As shown in FIG. 9A, a prescribed number of underlying wiring layers 72, and insulation layers 73 covering them are formed on the opposite sides of a core board 71 (for example, using a build-up method). An uppermost wiring layer 74 of copper (Cu) is formed On the uppermost insulation layer using, e.g., a semi-additive method. Herein, respective ones of the underlying wiring layers 72 and the insulation layers 73 covering them are shown for simplification. The upper and lower layer wirings are, if required, connected to each other via a via 75.

Figure 9B:
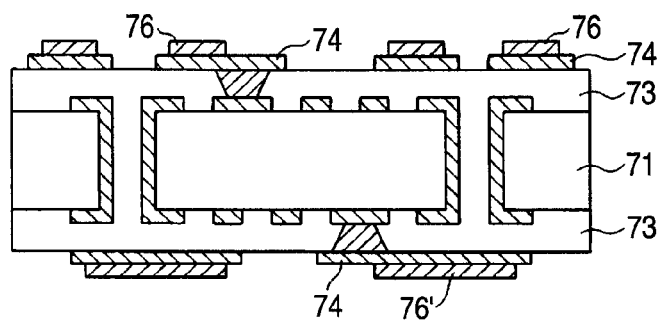

As shown in FIG. 9B, a pad 76 is formed on the uppermost wiring layer 74 on the top side, and a pad 76' is formed on the uppermost wiring layer 74 on the bottom side, using a semi-additive method. Then, a seed layer (not shown) used for forming the wiring layer 74 is removed by etching. The pad 76 to be formed on the top side has a diameter of, e.g., 75 μm, and a height of, e.g., 20 μm. The pitch between the adjacent pads is, e.g., 200 μm. The pad 76' on the bottom side has a diameter of, e.g., 250 μm, and a height of, e.g., 20 μm. The pitch between the adjacent pads is, for example, 800 μm.

Figure 9C:
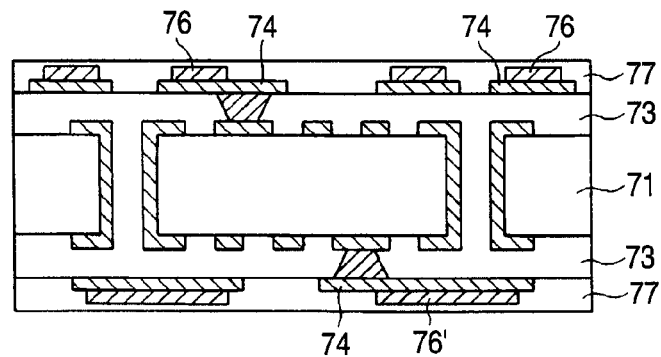

Subsequently, an insulation resin material is disposed on the uppermost wiring layer 74, and pressed. As a result, as shown in FIG. 9C, insulation resin layers 77 respectively covering the pads 76 and 76' on the uppermost wiring layers 74 are formed so that the surfaces thereof are flat. For the amount of the insulation resin material to be used, the amount necessary for the insulation layer to be formed is predetermined by calculation so that each thickness of the portions covering the pads 76 and 76' of the insulation resin layers 77 is 10 μm or less, and preferably 5 μm or less.

Figure 9D:
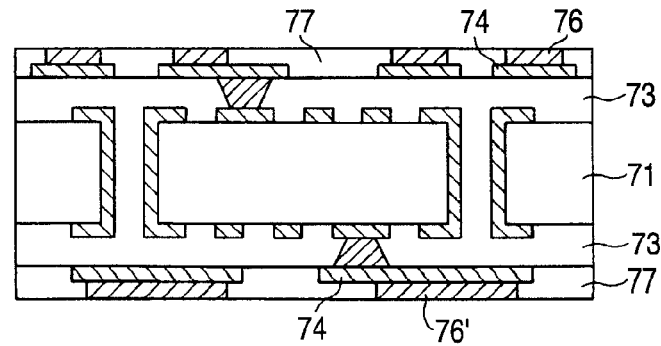

A part of each insulation resin layer 77 formed is uniformly removed along the direction of thickness. As a result, as shown in FIG. 9D, each top portion of the pads 76 and 76' is exposed at the surface of each insulation resin layer 77. The insulation resin is removed by a technique such as buff grinding, sandblast, or resin etching.

The surfaces of the pads 76 and 76' of the wiring board of FIG. 9D may be cleaned by Cu soft etching. Further, a protective plating (e.g., Ni/Au plating) layer may be formed on each surface of the pads 76 and 76'.

The wiring board of FIG. 9D manufactured in this example can mount semiconductor chips (not shown) on the matrix arrayed pads 76 on the top side, and also can be mounted on another mounting board using bumps (not shown) formed by solder or the like provided on the pads 76' on the bottom side.

Second Exemplary Embodiment

A description will be given to an example of manufacturing of a wiring board having peripheral arrayed pads.

Figure 10A:
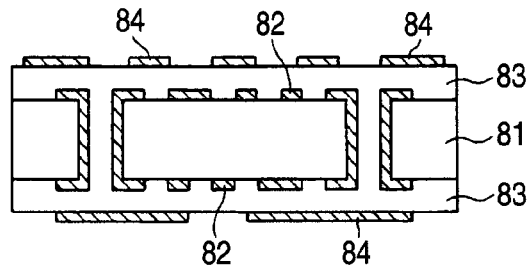
FIGS. 10A to 10E are schematic views illustrating manufacturing of a wiring board according to a second exemplary embodiment.

As shown in FIG. 10A, a prescribed number of underlying wiring layers 82, and insulation layers 83 covering them are formed on the opposite sides of a core board 81 using a build-up method. An uppermost wiring layer 84 of Cu is formed on the uppermost insulation layer using a semi-additive method. Out of five wirings of the wiring layer 84 on the top side as shown, the opposite-side two are wirings provided in a peripheral region on each of which a pad is formed. Also herein, respective ones of the underlying wiring layers 82 and the insulation layers 83 covering them are shown for simplification. The via for connecting the upper and lower layer wirings is omitted.

Figure 10B:
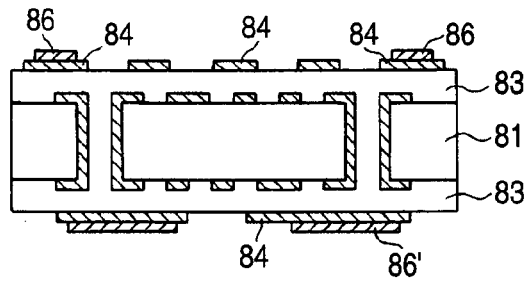

As shown in FIG. 10B, pads 86 are formed on the wiring in the peripheral region of the uppermost wiring layer 84 on the top side, and pads 86' are formed on the wiring of the uppermost wiring layer 84 on the bottom side, using a semi-additive method. Then, a seed layer (not shown) used for forming the wiring layer 84 is removed by etching. The pad 86 to be formed on the top side has a width of, e.g., 20 μm, and a height of, e.g., 20 μm. The pitch between the adjacent pads is, e.g., 50 μm. The pad 86' on the bottom side has a cross section in the form of a circle with a diameter of, e.g., 250 μm, and a height of, e.g., 20 μm. The pitch between the adjacent pads is, e.g., 800 μm.

Figure 10C:
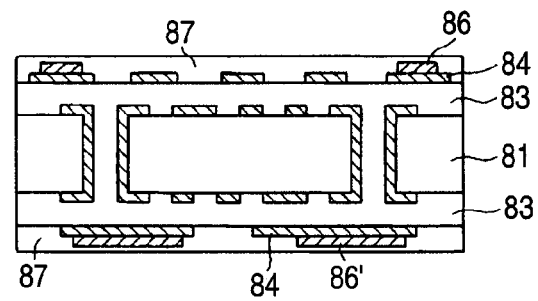

As described in the first exemplary embodiment, an insulation resin material is disposed on the uppermost wiring layer 84, and pressed. As a result, as shown in FIG. 10C, insulation resin layers 87 respectively covering the pads 86 and 86' on the uppermost wiring layers 84 are formed so that the each thickness on the pads 86 and 86' are 10 μm or less, and preferably 5 μm or less.

Figure 10D:
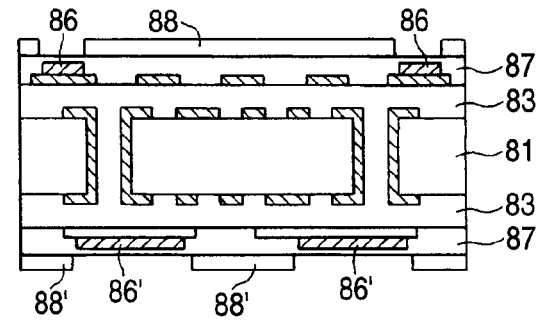

As shown in FIG. 10D, masks 88 and 88' for sandblast having openings larger by 20 μm than the width of the pad 86 and the diameter of the pad 86' respectively are formed. Subsequently, a part of each of the insulation resin layers 87 exposed in the openings of the masks 88 and 88' is removed by sandblast. Thereafter, the masks 88 and 88' are removed, thereby obtaining a wiring board in which each top portion of the pads 86 and 86' is exposed at the slightly concave portion of each insulation resin layer 87 as shown in FIG. 10E.

Figure 10E:
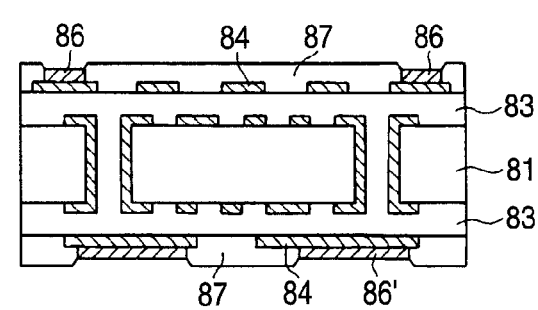

The surfaces of the pads 86 and 86' of the wiring board of FIG. 10E may be cleaned by Cu soft etching. Further, a protective plating (e.g., Ni/Au plating) layer may be formed on each surface of the pads 86 and 86'.

The wiring board of FIG. 10E manufactured in this example may mount semiconductor chips (not shown) and the like on the peripheral arrayed pads 86 on the top side, and also may be mounted on another mounting board using bumps (not shown) formed by solder or the like provided on the pads 86' on the bottom side.

Third Exemplary Embodiment

A description will be given to another example of manufacturing of a wiring board having peripheral arrayed pads.

Figure 11A:
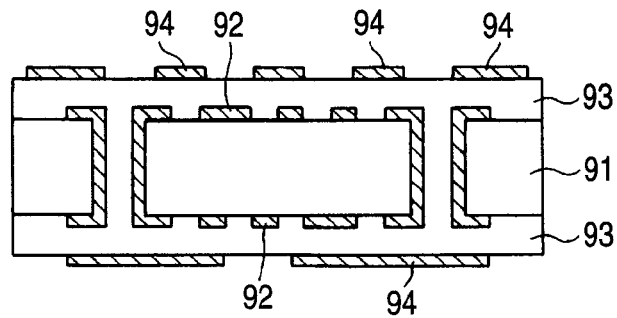
FIGS. 11A to 11D are schematic views illustrating manufacturing of a wiring board according to a third exemplary embodiment.

As shown in FIG. 11A, a prescribed number of underlying wiring layers 92, and insulation layers 93 covering them are formed on the opposite sides of a core board 91 using a build-up method. An uppermost wiring layer 94 of Cu is formed on the uppermost insulation layer using a semi-additive method. Out of five wirings of the wiring layer 94 on the top side shown, the opposite-side two are wirings serving as pads in a peripheral region. Also herein, respective ones of the underlying wiring layers 92 and the insulation layers 93 covering them are shown for simplification. The via for connecting the upper and lower layer wirings is omitted.

Figure 11B:
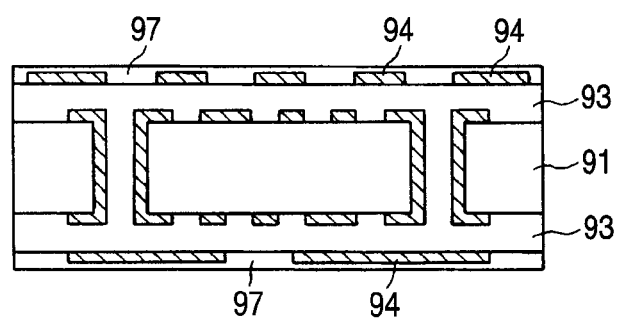

As described in the first exemplary embodiment, an insulation resin material is disposed on the uppermost wiring layer 94, and pressed. As a result, as shown in FIG. 11B, insulation resin layers 97 respectively covering the uppermost wiring layers 94 are formed so that the each thickness on the wiring of the wiring layers 94 are 10 μm or less, and preferably 5 μm or less.

Figure 11C:
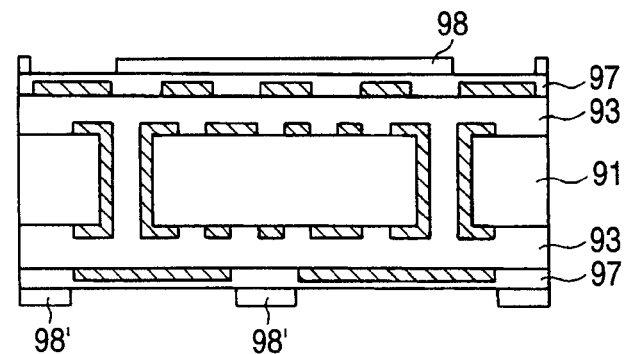

As shown in FIG. 11C, masks 98 and 98' for sandblast are formed. Then, a part of each of the insulation resin layers 97 exposed in the openings is removed by sandblast. Thereafter, the masks 98 and 98' are removed, thereby obtaining a wiring board in which each top portion of the pads 96 and 96' is exposed at the slightly concave portion of each insulation resin layer 97 as shown in FIG. 11D.

Figure 11D:
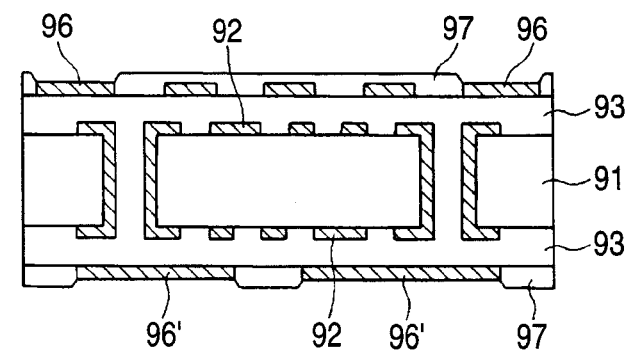
Figure 12A:
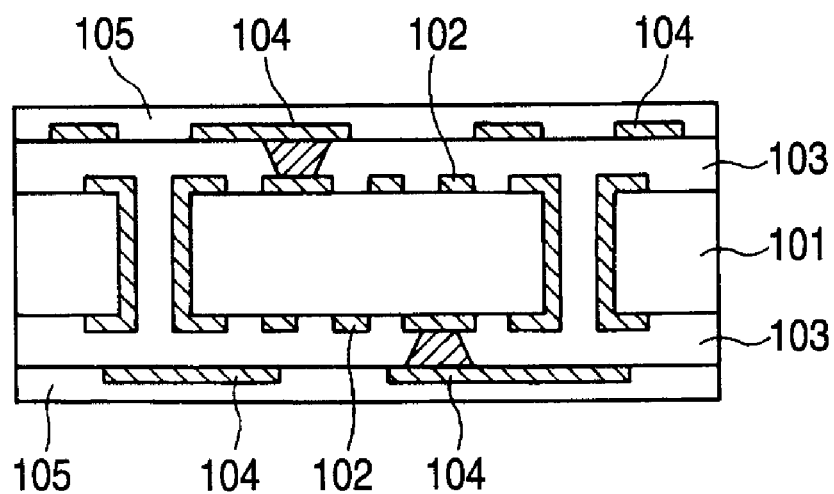
FIGS. 12A and 12B are schematic views illustrating exposure of pads by patterning of an insulation resin layer through photolithography in accordance with the related art.
Figure 12B:
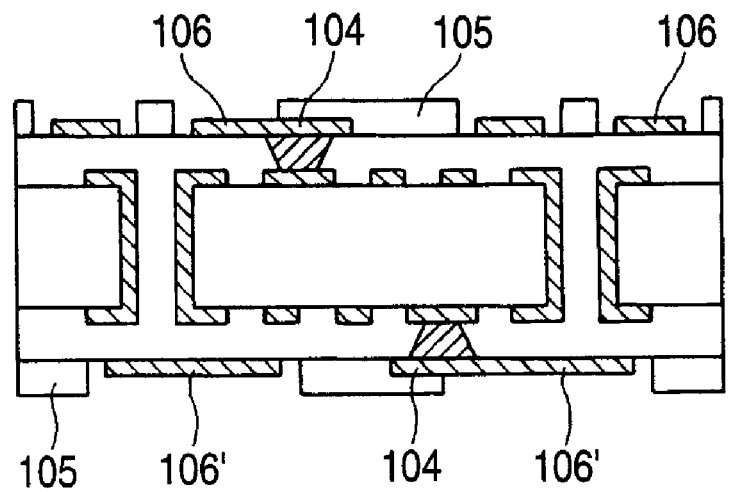

The surfaces of the pads 96 and 96' of the wiring board of FIG. 11D may also be cleaned by Cu soft etching. Further, a protective plating (e.g., Ni/Au plating) layer may be formed on each surface of the pads 96 and 96'.

The wiring board of FIG. 11D manufactured in this example may mount semiconductor chips (not shown) and the like on the peripheral arrayed pads 96 on the top side, and also be mounted on another mounting board using bumps (not shown) formed by solder or the like provided on the pads 96' on the bottom side In the first to third exemplary embodiments, the pads 76', 86', and 96' on the bottom side are formed in the same manner as for the pads 76, 86, and 96 on the top side on which semiconductor chips or the like are mounted. However, it is also possible to form them in a different manner from that for the pads 76, 86, and 96 on the top side. For example, in the case of the wiring board described in the first exemplary embodiment, the pads 76' on the bottom side may also be formed in the manner of the second or third exemplary embodiment. Alternatively, they may also be formed in a well-known manner.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the invention.

What is claimed is:

1. A wiring board according comprising:
    an uppermost wiring layer formed on a prescribed number of underlying wiring layers, a portion of said uppermost wiring layer being exposed and used as a pad for connection with a component to be mounted; and
    an insulation resin layer covering the uppermost wiring layer, the insulation resin layer defining an opening through which an entire surface of the pad is exposed, the opening having an area greater than that of the surface of the pad,
    wherein a distance between an edge of the surface of the pad and an edge of the opening defined in the insulation resin layer is in a range of 3-10 μm.

2. The wiring board according to claim 1, wherein a thickness of the pad is larger than a thickness of other portions of the uppermost wiring layer.

3. The wiring board according to claim 1, wherein a thickness of the pad is substantially equal to a thickness of other portions of the uppermost wiring layer.

4. The wiring board according to claim 1,
wherein the opening defined in the insulation resin layer is formed by a sandblast method using a mask having an opening whose area is larger than that of the surface of the pad.

5. The wiring board according to claim 4, wherein a thickness of the pad is larger than a thickness of other portions of the uppermost wiring layer.

6. The wiring board according to claim 5, wherein the pad is formed into a columnar shape.

7. The wiring board according to claim 6, wherein the columnar-shaped pad has a uniform diameter.

8. The wiring board according to claim 4, wherein a thickness of the pad is substantially equal to a thickness of other portions of the uppermost wiring layer.

* * * * *